United States Patent
Jau et al.

(10) Patent No.: US 10,346,271 B2
(45) Date of Patent: Jul. 9, 2019

(54) MANAGE POWER SUPPLY UNITS AND MODULARIZED AUTOMATIC TRANSFER SWITCHES

(71) Applicant: Quanta Computer Inc., Taoyuan (TW)

(72) Inventors: Maw-Zan Jau, Taoyuan (TW); Chin-Hsiang Chan, Taoyuan (TW)

(73) Assignee: QUANTA COMPUTER INC., Toayuan (TW)

( * ) Notice: Subject to any disclaimer, the term of this patent is extended or adjusted under 35 U.S.C. 154(b) by 102 days.

(21) Appl. No.: 14/980,608

(22) Filed: Dec. 28, 2015

(65) Prior Publication Data
US 2017/0185495 A1 Jun. 29, 2017

(51) Int. Cl.
| G06F 11/00 | (2006.01) |
| G06F 11/20 | (2006.01) |
| G06F 1/26  | (2006.01) |
| G06F 11/30 | (2006.01) |
| G06F 11/07 | (2006.01) |

(52) U.S. Cl.
CPC ............ G06F 11/2015 (2013.01); G06F 1/26 (2013.01); G06F 11/3031 (2013.01); *G06F 11/0751* (2013.01); *G06F 11/0793* (2013.01); *G06F 11/3062* (2013.01)

(58) Field of Classification Search
CPC ............. G06F 11/2015; G06F 11/3006; G06F 11/3062
See application file for complete search history.

(56) References Cited

U.S. PATENT DOCUMENTS 4,700,381 A * 10/1987 Eher .................. G06F 11/2007
                                                        379/279
2008/0028238 A1* 1/2008 Lucas ...................... G06F 1/26
                                                        713/300
(Continued)

FOREIGN PATENT DOCUMENTS

CN         103633728 A       3/2014
CN         104345854 A       2/2015
(Continued)

OTHER PUBLICATIONS

Taiwanese Office Action for Application No. 105113228, dated Jan. 26, 2017, w/ First Office Action Summary.
(Continued)

*Primary Examiner* — Bryce P Bonzo
*Assistant Examiner* — Katherine Lin
(74) *Attorney, Agent, or Firm* — Nixon Peabody LLP; Zhou Lu

(57) ABSTRACT

Various embodiments of the present technology provide systems and methods to pair each of a plurality power supply units (PSUs) of a server system with a corresponding one of a plurality of ATS modules. A failed ATS module or PSU can be detected and replaced without forcing a shutdown of the remaining pairs of PSUs and ATS modules of the server system. In some embodiments, a controller of the server system can monitor status of each of the plurality ATS modules and the plurality of PSUs. Based at least in part upon statuses of the plurality ATS modules and the plurality of PSUs, the controller may further determine an optimized output power of the PSUs and manage loading of the server system.

17 Claims, 7 Drawing Sheets

(56) References Cited

U.S. PATENT DOCUMENTS

| | | | |
|---|---|---|---|
| 2014/0095900 A1* | 4/2014 | Chen | G06F 1/26 713/300 |
| 2014/0160601 A1* | 6/2014 | Ouyang | H02M 3/158 361/18 |
| 2015/0220349 A1* | 8/2015 | Taniguchi | G06F 8/665 713/2 |
| 2016/0006223 A1* | 1/2016 | Sinistro | H02B 1/052 361/622 |
| 2017/0005510 A1* | 1/2017 | Rohr | H02J 9/06 |

FOREIGN PATENT DOCUMENTS

| | | | |
|---|---|---|---|
| TW | 201407929 | * | 2/2014 |
| TW | 201407929 A | | 2/2014 |
| WO | 2015094290 A1 | | 6/2015 |

OTHER PUBLICATIONS

Taiwanese Search Report for Application No. 105113228, dated Jan. 26, 2017.

* cited by examiner

MANAGE POWER SUPPLY UNITS AND MODULARIZED AUTOMATIC TRANSFER SWITCHES

TECHNICAL FIELD

The present technology relates generally to power supply systems in a telecommunications network.

BACKGROUND

Modern server farms or datacenters typically employ a large number of servers to handle processing needs for a variety of application services. Each server handles various operations and requires a certain level of power consumption to maintain these operations. Some of these operations are "mission critical" operations, interruptions to which may lead to significant security breach or revenue losses for users associated with these operations.

For example, an input AC power to power supply units (PSUs) of a server system may fail. A failure or a fault in the input AC power can force a sudden shutdown of a server system, possibly resulting in data loss or even damage to the server system. One solution is to use an automatic transfer switch (ATS) to switch the PSUs to a second AC input power when a first AC input power fails. However, a failure of the ATS may force a shutdown of the PSUs. An improvement is desired to further boost the reliability of power supplies to the server system.

SUMMARY

Systems and methods in accordance with various embodiments of the present technology provide a solution to the above-mentioned problems by managing power supply units (PSUs) and a modularized automatic transfer switch (ATS) system in a server system. More specifically, various embodiments of the present technology provide systems and methods to pair each of a plurality power supply units (PSUs) of a server system with a corresponding one of a plurality of ATS modules. A failed ATS module or PSU can be detected and replaced without forcing a shutdown of the remaining pairs of PSUs and ATS modules of the server system. In some embodiments, a controller of the server system can monitor status of each of the plurality ATS modules and the plurality of PSUs. Based at least in part upon statuses of the plurality ATS modules and the plurality of PSUs, the controller may further determine an optimized output power of the PSUs and manage loading of the server system.

Some embodiments use an output signal of the plurality of PSUs of the server system as an auxiliary power to each of the plurality of ATS modules. For example, a standby power of the PSUs may be used as an auxiliary power to the ATS modules. The auxiliary power can be uninterruptible unless the PSUs have all failed or there is no AC input power to the server system.

In some embodiments, each of the plurality of ATS modules has a port to receive an AC fail signal, an auxiliary power, or an AC initial signal from the plurality of PSUs of the server system or a component (e.g., voltage detection circuit, or a component of a backplane of the server system) of the server system. An ATS module may manage a paired PSU based at least upon signal received at the port.

For example, the AC initial signal may include status information of a first AC input power and a second AC input power to the plurality of ATS modules. Based upon the AC initial signal, an ATS module can select a suitable AC input power to get power. For example, if a first AC input power has no power during an initialization, the ATS module can select another AC input power to supply power to the paired PSU. Some embodiments provide an AC OK signal from a PSU to a paired ATS module of the server system. The ATS module can determine a status of an AC input power based at least upon the AC OK signal.

In some implementations, in response to determining that one AC input power has a low quality, an ATS module can automatically switch to another AC input power to maintain a steady AC quality. The AC quality may include, but is not limited to, a range of AC voltage value (i.e., above a threshold under voltage value and below a threshold over-voltage value), a range of AC frequency, and a threshold power factor value. In some embodiments, AC powers to the server system can be supplied by different power vendors. Fee schedules of the power vendors can be determined and stored on the server system. An ATS module may switch to a particular AC input power supplied by a corresponding power vendor based at least upon the fee schedules to minimize an electricity cost of the server system.

In some embodiments, each of the plurality of ATS modules includes a built-in over-current protection (OCP) circuit. A failed PSU may cause a current spike in an AC input power that can shut down or even damage the AC input power circuit. The OCP circuit of an ATS module is configured to cap an input current flowing through the ATS module and a paired PSU. In some implementations, in response to determining that an input current of a PSU has reached a cap current, a paired ATS module can notify a controller of the server system. In some embodiment, a controller may electronically isolate a failed PSU from input AC powers or other PSUs of the server system such that the failed PSU does not affect other components of the server system and can be replaced.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

More specifically, various embodiments of the present technology provide systems and methods to pair each of a plurality power supply units (PSUs) of a server system with a corresponding one of a plurality of ATS modules. A failed ATS module or PSU can be detected and replaced without forcing a shutdown of the remaining pairs of PSUs and ATS modules of the server system. In some embodiments, a controller of the server system can monitor status of each of the plurality ATS modules and the plurality of PSUs. Based at least in part upon statuses of the plurality ATS modules and the plurality of PSUs, the controller may further determine an optimized output power of the PSUs and manage loading of the server system.

Figure 1A:
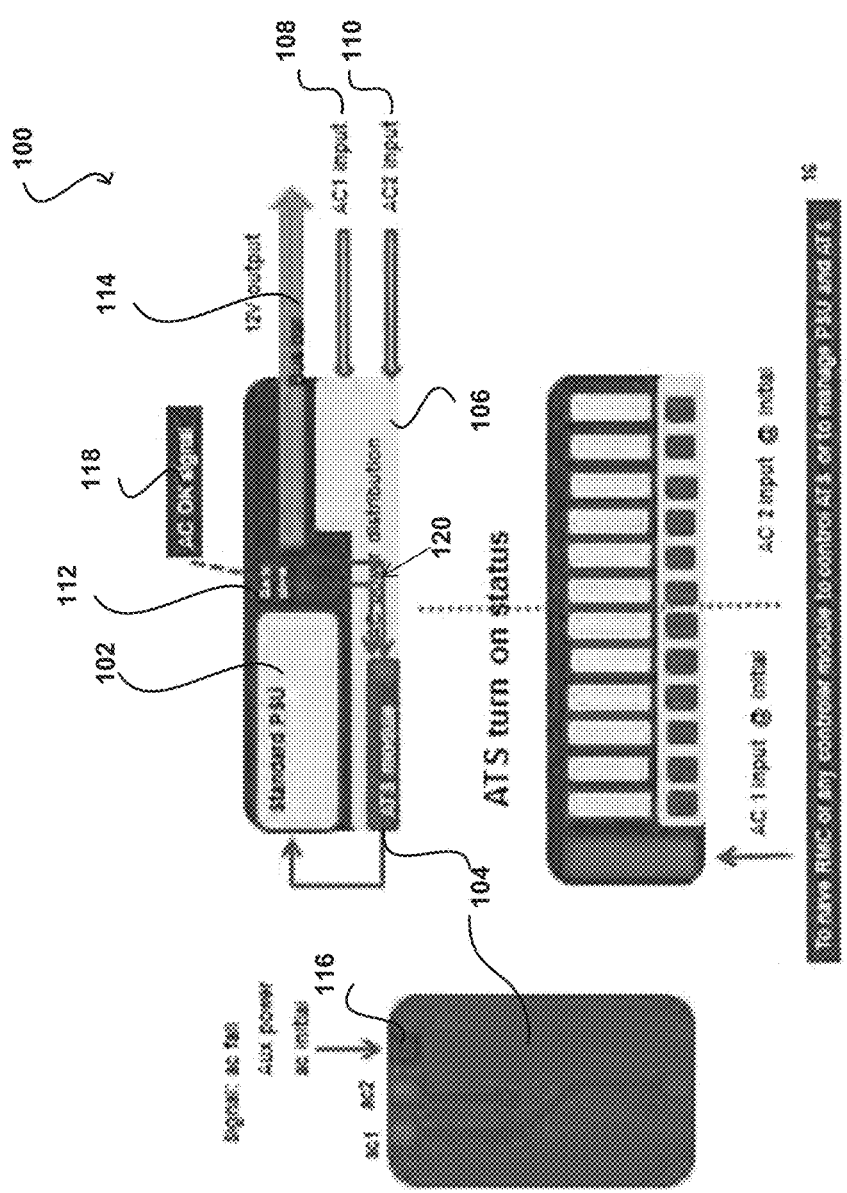
FIGS. 1A, 1B, and 1C illustrate schematic block diagrams of exemplary power supply units (PSUs) and exemplary automatic transfer switches (ATS) modules in accordance with an implementation of the present technology.
Figure 1B:
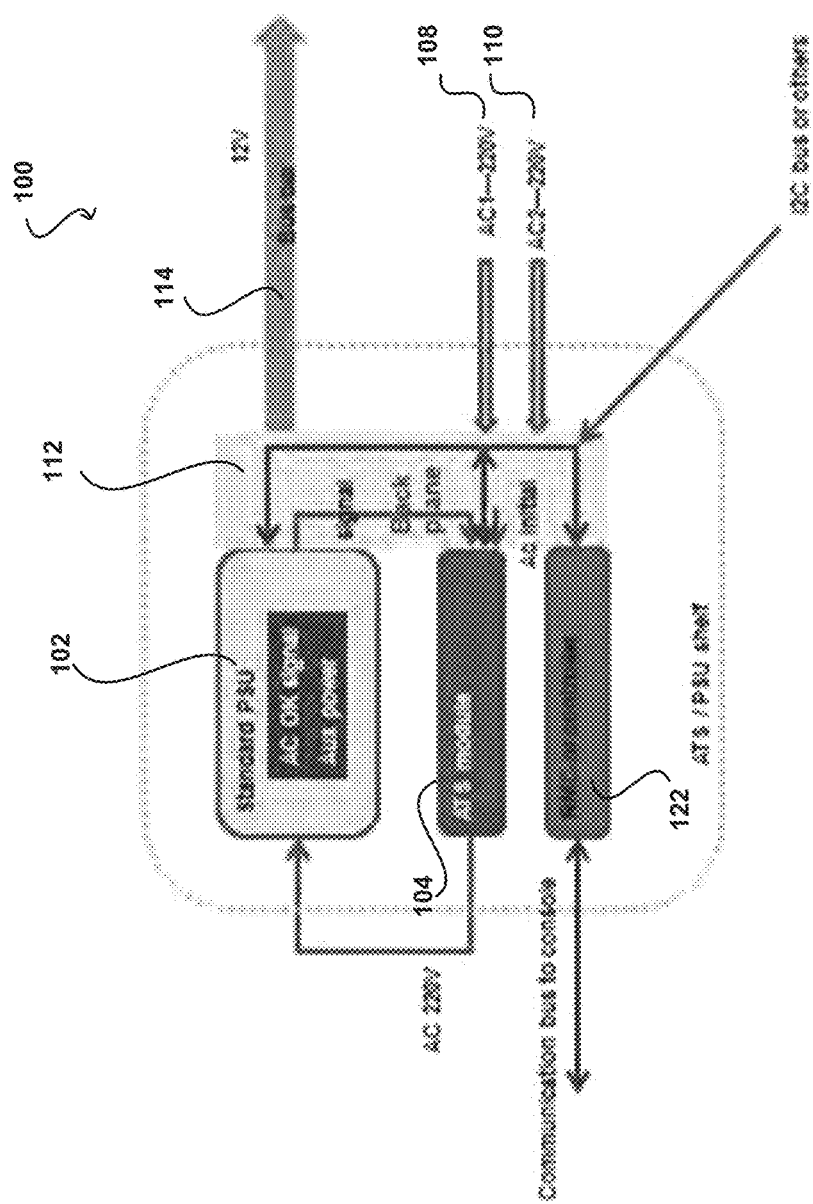
Figure 1C:
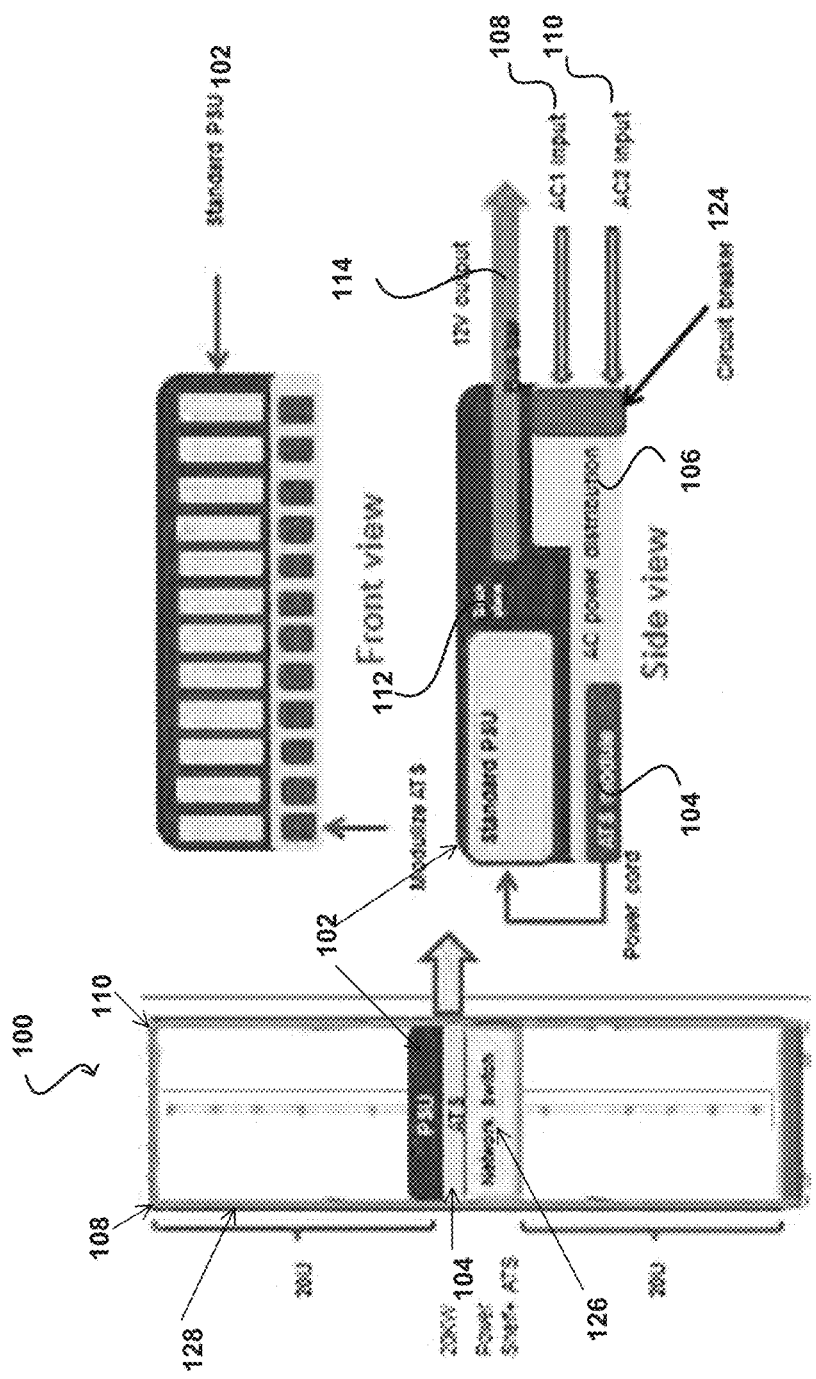

FIGS. 1A-1C illustrate schematic block diagrams of exemplary power supply units (PSUs) 102 and exemplary automatic transfer switches (ATS) modules 104 of a server system 100 in accordance with an implementation of the present technology. As illustrated in FIG. 1A, the server system 100 includes a plurality of PSUs 102 and a plurality of ATS modules 104. The plurality of ATS modules 104 is coupled to an AC1 input 108 and an AC2 input 110 via an AC power distribution system 106. The plurality of PSUs 102 supplies powers to a backplane 112, a Bus bar 114 and other components of the server system 100. Each ATS module can include a port 116 to receive a signal (e.g., an AC fail signal (not shown), an AC OK signal 118, an auxiliary power 120, or an AC initial signal (not shown)) from the plurality of PSUs 102, the backplane 112, the Bus bar 114, or another component of the server system 100. In some embodiments, the auxiliary power 120 can be a standby power of the PSUs 102. The auxiliary power 120 is uninterruptible unless all the plurality of PSUs 102 have failed or all AC input powers (e.g., AC1 input 108 and AC2 input 110) to the server system are interrupted. There is no need to incorporate a separate auxiliary power circuit into the ATS module 104.

The AC initial signal to the port 116 of an ATS module may contain initial status information of two or more AC power inputs (e.g., AC1 input 108 and AC2 input 110). In the event of one or more AC power inputs having no power during an initialization, the ATS module can select a suitable AC power input for a paired PSU based upon the AC initial signal.

The AC OK signal 118 may contain present status information of two or more AC power inputs to an ATS module. In some embodiments, the AC OK signal 118 to an ATS module can be provided by a paired PSU. The ATS module 104 can determine whether a connected AC power input is ok based upon the AC OK signal 118. There is no need to incorporate a separate AC detection circuit into the ATS module 104, which can further reduce the size and cost of the ATS module.

The ATS module 104 can further include an over-current protection (OCP) circuit (not shown). The OCP circuit can be integrated into the ATS module or is a discrete circuit. The OCP circuit is configured to cap an input current flowing through the ATS module and a paired PSU such that an AC power input or other components of the server system 100 can be protected in case the ATS module or the paired PSU fails.

FIG. 1B illustrates a schematic block diagram of an exemplary controller 122 managing the plurality of PSU 102 and the plurality of ATS modules 104 in accordance with an implementation of the present technology. In this example, the controller 122 (e.g., rack management controller (RMC)) is connected with the plurality of PSUs 102 and the plurality of ATS modules 104 via the bus 114 (e.g., a I²C bus). The controller can monitor a status of each of the plurality ATS modules 104 and the plurality of PSUs 102 through the bus 114. Based at least in part upon the status of the plurality ATS modules and the plurality of PSUs, the controller 122 can further determine an optimized output power of the PSUs 102 and, thus, manage loading of the server system. In some embodiments, in response to determine that an ATS module or a PSU has failed, the controller 122 may electronically isolate the failed ATS module or the failed PSU from other components of the server system 100 and allow the failed ATS module or the failed PSU to be replaced without forcing a shutdown of the server system 100.

In some embodiments, each of the plurality of ATS modules 104 and the plurality of PSUs 102 further include a light indicator (not shown) that shows operation statuses by emitting lights with various colors. In response to determine that a particular ATS module or PSU has failed, the controller 122 can send a control signal to turn on a specific color (e.g., red color) of the light indicator of the failed ATS module or PSU such that the failed component can be easily identified.

FIG. 1C illustrates a schematic block diagram of an exemplary power shelf 128 housing a plurality of PSU 102 and a plurality of ATS modules 104 in accordance with an implementation of the present technology. In this example, the power shelf 128 houses the plurality of PSU 102, the plurality of ATS modules 104, and a network switch 126. The ATS modules 104 are coupled to an AC1 input 108 and an AC2 input 110 via an AC power distribution 106 and a circuit breaker 124.

The network switch 126 is configured to allow a controller (e.g., the controller 122 as shown in FIG. 1B) to communicate with other server systems or an administrator over a network. In some embodiments, a controller of a remote server system or an administrator may remotely monitor and manage the plurality of PSU 102 and the plurality of ATS modules 104 of the server system 100 thought the network switch 126.

Figure 1D:
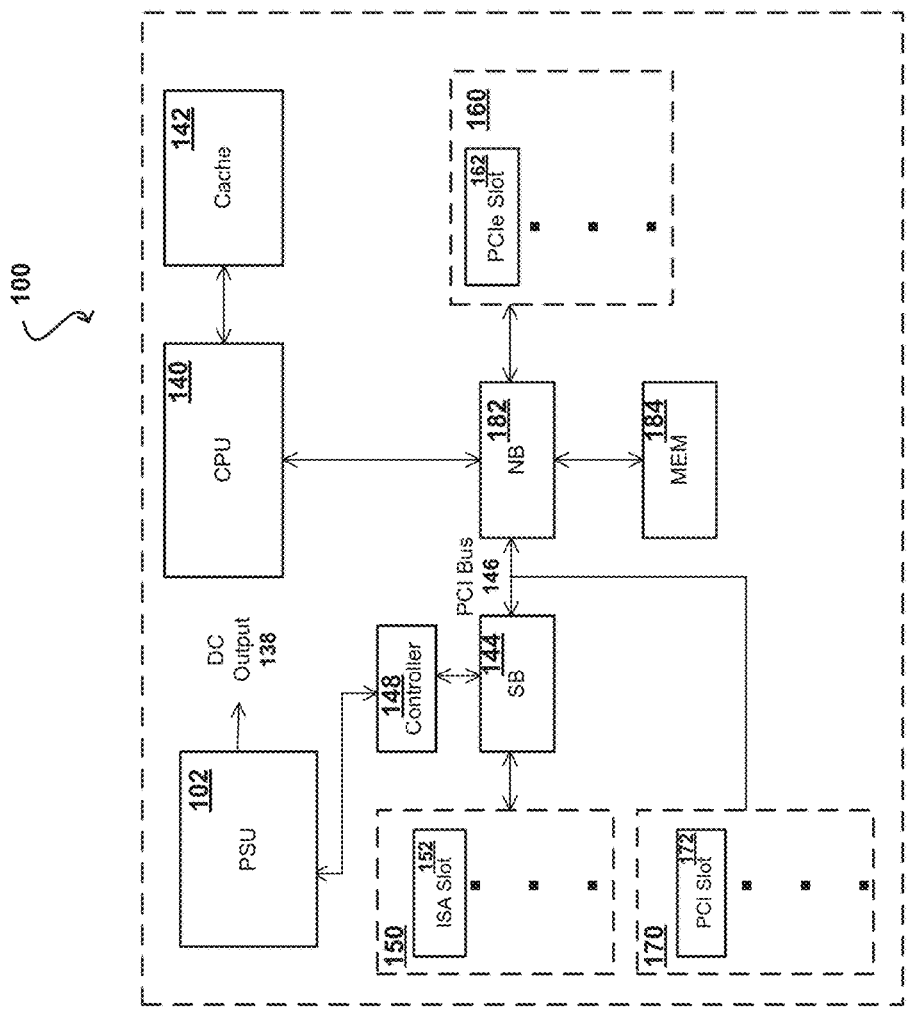
FIG. 1D illustrates a schematic block diagram of an exemplary server system in accordance with an implementation of the present technology.

FIG. 1D illustrates a schematic block diagram of an exemplary server system 100 in accordance with an implementation of the present technology. In this example, the server system 100 comprises at least one microprocessor or CPU 140 connected to a Cache 142, a main Memory 184, and one or more PSUs 102 that provides power to the server system 100. The main Memory 184 can be coupled to the CPU 140 via a north bridge (NB) logic 182. A memory control module (not shown) can be used to control operations of the Memory 184 by asserting necessary control signals during memory operations. The main Memory 184 may include, but is not limited to, dynamic random access memory (DRAM), double data rate DRAM (DDR DRAM), static RAM (SRAM), or other types of suitable memory.

In some implementations, the CPU 140 can be multi-core processors, each of which is coupled together through a CPU bus connected to the NB logic 182. In some implementations, the NB logic 182 can be integrated into the CPU 140. The NB logic 182 can also be connected to a plurality of peripheral component interconnect express (PCIe) ports 160 and a south bridge (SB) logic 144 (optional). The plurality of PCIe ports 160 can be used for connections and buses such as PCI Express x1, USB 2.0, SMBus, SIM card, future extension for another PCIe lane, 1.5 V and 3.3 V power, and wires to diagnostics LEDs on the server's chassis.

In this example, the NB logic 182 and the SB logic 144 (optional) are connected by a peripheral component interconnect (PCI) Bus 146. The PCI Bus 146 can support function on the CPU 140 but in a standardized format that is independent of any of CPU's native buses. The PCI Bus 146 can be further connected to a plurality of PCI slots 170

(e.g., a PCI Slot 172). Devices connect to the PCI Bus 146 may appear to a bus controller (not shown) to be connected directly to a CPU bus, assigned addresses in the CPU 140's address space, and synchronized to a single bus clock. PCI cards can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 144 (optional) can couple the PCI Bus 146 to a plurality of expansion cards or slots 150 (e.g., an ISA slot 152) via an expansion bus. The expansion bus can be a bus used for communications between the SB logic 144 (optional) and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In the example, the SB logic 144 (optional) is further coupled to a Controller 148 (e.g., the controller 122 as illustrated in FIG. 1B) that is connected to the one or more PSUs 102. The one or more PSUs 102 are configured to supply powers to various component of the server system 100, such as the CPU 140, Cache 142, NB logic 182, PCIe slots 160, Memory 184, SB logic 144 (optional), ISA slots 150, PCI slots 170, and Controller 148. After being powered on, the server system 100 is configured to load software application from memory, computer storage device, or an external storage device to perform various operations.

In some implementations, the Controller 148 can be a baseboard management controller (BMC), rack management controller (RMC), a keyboard controller, or any other suitable type of system controller. In some embodiments, the Controller 148 can be configured to control operations of the one or more PSUs 102 in the server system and/or other applicable operations.

Some implementations enable the Controller 148 to collect historical data of the server system 100 and the one or more PSUs 100. As used herein with respect to a server system or portions thereof, the term "load" or "loading" refers to the amount of computational work that the server system 100 (or portions thereof) has performed or the amount of power that the one or more PSUs 102 have supplied at a time of interest.

Collected present and/or historical loading information can be analyzed and used to determine an optimized output power of the one or more PSUs 102 according to one or more machine-learning algorithms. In some embodiments, the one or more machine-learning algorithms can further include at least one of a linear regression model, neural network model, support vector machine based model, Bayesian statistics, case-based reasoning, decision trees, inductive logic programming, Gaussian process regression, group method of data handling, learning automata, random forests, ensembles of classifiers, ordinal classification, or conditional random field. For example, a neural network model can be used to analyze historical loading information and to capture complex correlation between loading of the server system 100 and an optimized output power of the one or more PSUs.

In some implementations, the Controller 148 can collect parameters (e.g., temperature, cooling fan speeds, power status, memory and/or operating system (OS) status) from different types of sensors that are built into the server system 100. In some implementations, the Controller 148 can also be configured to take appropriate action when necessary. For example, in response to any parameter on the different types of sensors that are built into the server system 100 going beyond preset limits, which can indicate a potential failure of the server system 100, the Controller 148 can be configured to perform a suitable operation in response to the potential failure. The suitable operation can include, but is not limited to, sending an alert to the CPU 140 or a system administrator over a network, or taking some corrective action such as resetting or power cycling the node to get a hung OS running again).

Although only certain components are shown within the server system 100 in FIGS. 1A-1D, various types of electronic or computing components that are capable of processing or storing data, or receiving or transmitting signals can also be included in server system 100, one or more PSUs 102, and one or more ATS modules 104. Further, the electronic or computing components in the server system 100 and the one or more PSUs 102 can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the server system 100, the one or more PSUs 102 and the one or more ATS modules 104, a variety of networking and messaging protocols can be used, including but not limited to TCP/IP, open systems interconnection (OSI), file transfer protocol (FTP), universal plug and play (UPnP), network file system (NFS), common internet file system (CIFS), AppleTalk etc. As would be appreciated by those skilled in the art, the server system 100 illustrated in FIGS. 1A-1D is used for purposes of explanation. Therefore, a network system can be implemented with many variations, as appropriate, yet still provide a configuration of network platform in accordance with various embodiments of the present technology.

In exemplary configuration of FIGS. 1A-1D, the server system 100, the one or more PSUs 102 and the one or more ATS modules 104 can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various embodiments.

Figure 2:
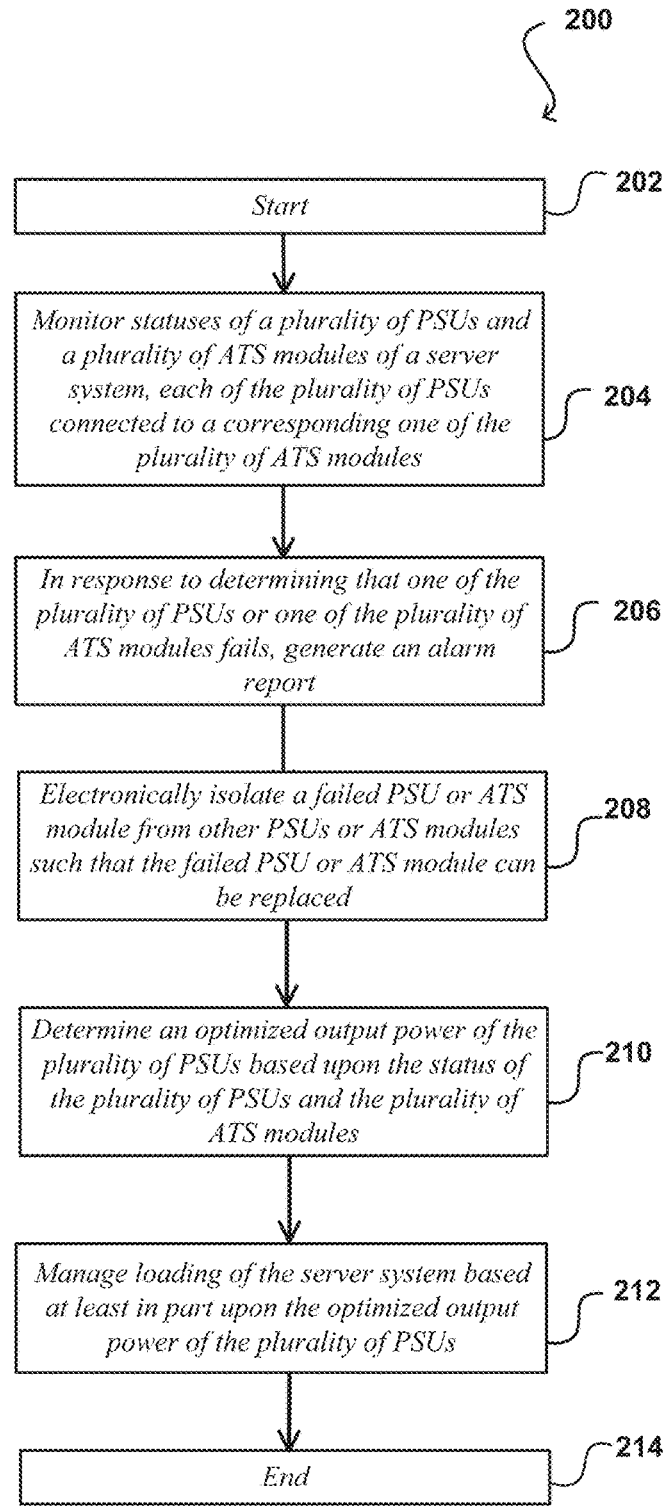
FIG. 2 illustrates an exemplary method of managing PSUs and ATS modules in accordance with an implementation of the present technology.

FIG. 2 illustrates an exemplary method 200 of managing a plurality of ATS modules and a plurality of PSUs of a server system in accordance with an implementation of the present technology. It should be understood that the exemplary method 200 is presented solely for illustrative purposes and that in other methods in accordance with the present technology can include additional, fewer, or alternative steps performed in similar or alternative orders, or in parallel. The exemplary method 200 starts at step 202.

At step 204, statuses of the plurality of PSUs and the plurality of ATS module of the server system can be monitored. For example, a controller, as illustrated in FIG. 1B, can be used to monitor the status of each PSU and ATS module of the server system. The controller is connected to the plurality of PSUs and the plurality of ATS module via a bus. Each PSU is paired with a corresponding one of the plurality of ATS modules to form a PSU-ATS module pair.

At step 206, in response to determining that one of the plurality of PSUs or one of the plurality of ATS modules fails, an alarm report can be generated. A failure of a power supply component (e.g., a PSU or an ATS module) can be detected by another component of a corresponding PSU-ATS module pair, a voltage detection circuit, or a controller of the server system. For example, a voltage detection circuit of a PSU or a backplane may check an input AC voltage or an output DC voltage of the PSU. In response to determining that the input AC voltage or the output DC voltage is beyond a threshold voltage range, the voltage detection circuit can generate an AC fail signal to a paired ATS module or a controller of the server system. The controller (e.g., a controller as illustrated in FIG. 1B) can receive the AC fail signal and generate an alarm report of the failed PSU or ATS module.

In some embodiments, a controller of the server system can analyze a received AC fail signal and determine a failed PSU or ATS module by comparing with known patterns of AC failures. Some PSUs and ATS modules can include a light indicator that shows operation statuses by emitting lights with corresponding colors. The controller may further send a control signal to cause a corresponding light indicator of the failed PSU or ATS module to emit a color-coded light such that the failed PSU or ATS module can be easily identified.

At step 208, a failed PSU or ATS module can be electronically isolated from at least one AC input, or other PSUs or ATS modules such that the failed PSU or ATS module can be replaced without forcing a shutdown of the other PSUs or ATS modules.

At step 210, an optimized output power of the plurality of PSUs can be determined based at least upon the status of the plurality of PSUs and the plurality of ATS modules. For example, an optimized output power of the plurality of PSUs may be reduced if one or more PSU-ATS module pair have a failure, are switched into hibernation, or are shut down. For another example, an optimized output power of the plurality of PSUs may also be determined based at least upon an optimized efficiency or service time of each of the plurality of PSUs, or an environment temperature of the plurality of PSUs.

At step 212, loading of the server system can be managed based at least upon the optimized output power of the plurality of PSUs. For example, historical data of loading and power consumption of the server system can be collected and analyzed. The collected historical data can be analyzed according to one or more machine learning algorithms and used to define a correlation between the loading of the server system and an output power of the plurality of PSUs.

In some embodiments, based at least in part upon the optimized output power of the plurality of PSUs, the loading of the server system may be dynamically managed using the one or more machine learning algorithms. For example, one or more PSU-ATS module pairs may be switched into hibernation, turned off, or turned on based upon projected loading of the server system.

In some embodiments, a controller of the server system can keep a prospective replacement list of all PSUs or ATS modules that have service times over a threshold time period. The controller may send out a PSU or ATS module replacement request to replace PSU(s) or ATS module(s) in the prospective replacement list when a projected loading of the server system is light.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
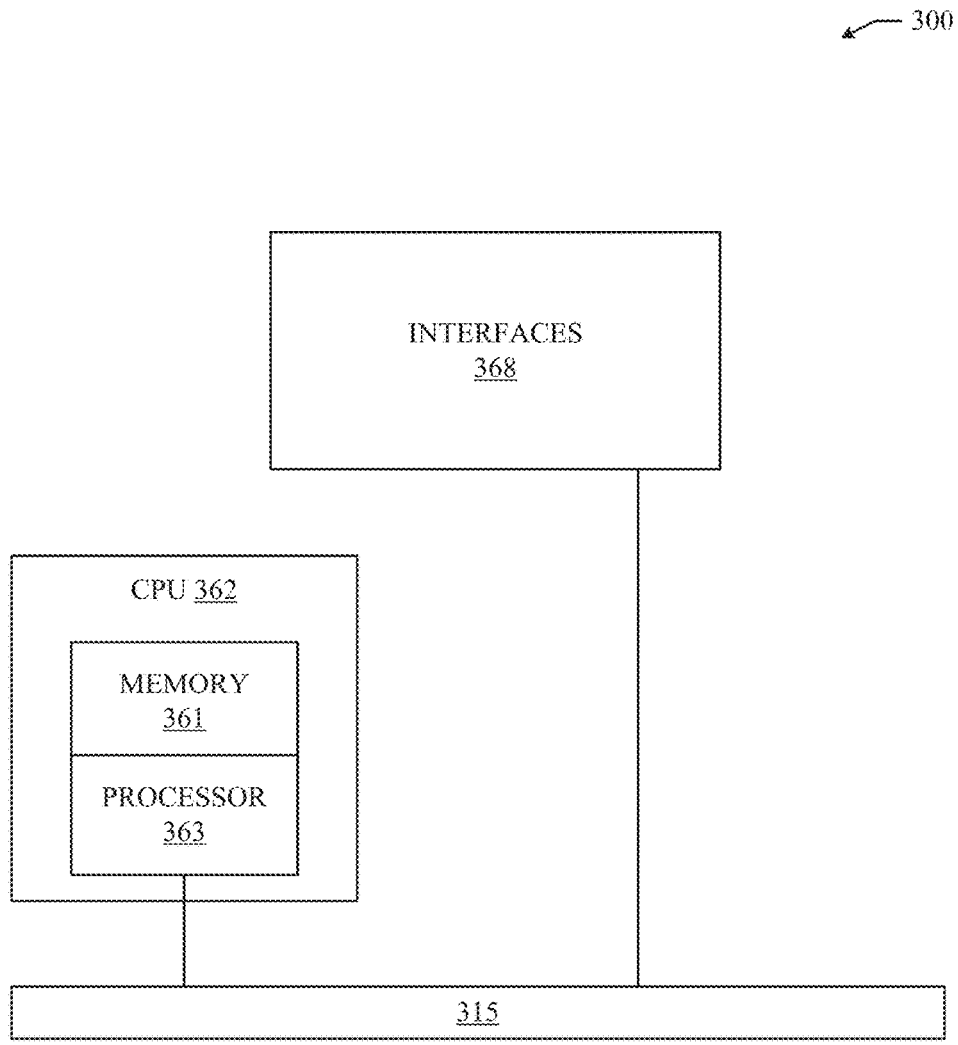
FIG. 3 illustrates an exemplary computing device in accordance with various implementations of the technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing at least some aspects of the present technology. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative embodiment, processor 363 is specially designed hardware for controlling the operations of the computing device 300. In a specific embodiment, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present technology, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 4A:
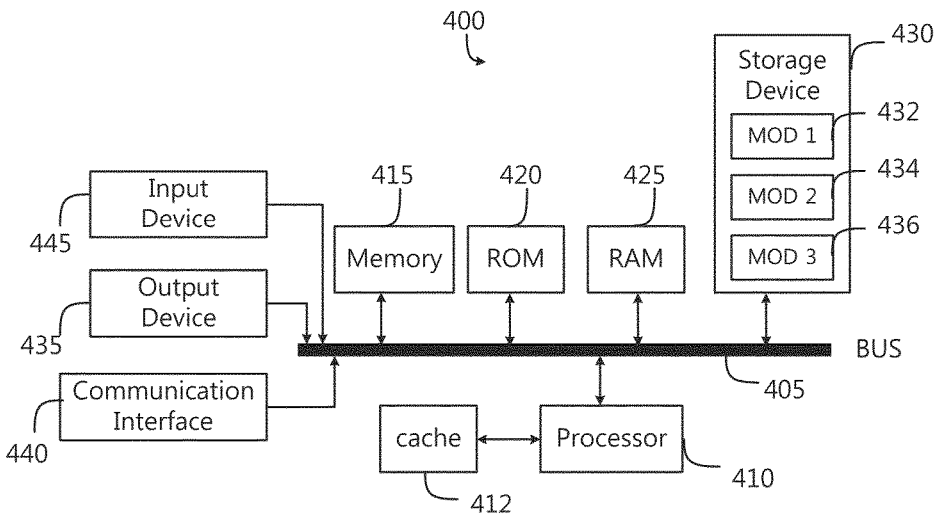
FIGS. 4A and 4B illustrate exemplary systems in accordance with various embodiments of the present technology.
Figure 4B:
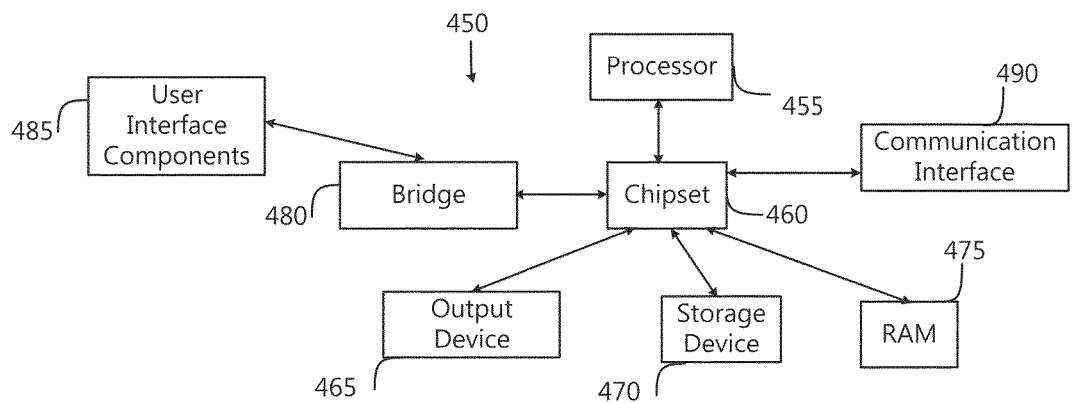

FIG. 4A, and FIG. 4B illustrate example possible systems in accordance with various aspects of the present technology. The more appropriate embodiment will be apparent to those of ordinary skill in the art when practicing the present technology. Persons of ordinary skill in the art will also readily appreciate that other system examples are possible.

FIG. 4A illustrates a conventional system bus computing system architecture 400 wherein the components of the system are in electrical communication with each other using a bus 405. Example system 400 includes a processing unit (CPU or processor) 410 and a system bus 405 that couples various system components including the system memory 415, such as read only memory (ROM) 420 and random access memory (RAM) 425, to the processor 410. The system 400 can include a cache of high-speed memory connected directly with, in close proximity to, or integrated as part of the processor 410. The system 400 can copy data from the memory 415 and/or the storage device 430 to the cache 412 for quick access by the processor 410. In this way, the cache can provide a performance boost that avoids processor 410 delays while waiting for data. These and other modules can control or be configured to control the processor 410 to perform various actions. Other system memory 415 can be available for use as well. The memory 415 can include multiple different types of memory with different performance characteristics. The processor 410 can include any general purpose processor and a hardware module or software module, such as module 432, module 434, and module 436 stored in storage device 430, configured to control the processor 410 as well as a special-purpose processor where software instructions are incorporated into the actual processor design. The processor 410 can essentially be a completely self-contained computing system, containing multiple cores or processors, a bus, memory controller, cache, etc. A multi-core processor can be symmetric or asymmetric.

To enable user interaction with the computing device 400, an input device 445 can represent any number of input mechanisms, such as a microphone for speech, a touch-sensitive screen for gesture or graphical input, keyboard, mouse, motion input, speech and so forth. An output device 435 can also be one or more of a number of output mechanisms known to those of skill in the art. In some instances, multimodal systems can enable a user to provide multiple types of input to communicate with the computing device 400. The communications interface 440 can generally govern and manage the user input and system output. There is no restriction on operating on any particular hardware arrangement and therefore the basic features here can easily be substituted for improved hardware or firmware arrangements as they are developed.

Storage device 430 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 425, read only memory (ROM) 420, and hybrids thereof.

The storage device 430 can include software modules 432, 434, 436 for controlling the processor 410. Other hardware or software modules are contemplated. The storage device 430 can be connected to the system bus 405. In one aspect, a hardware module that performs a particular function can include the software component stored in a computer-readable medium in connection with the necessary hardware components, such as the processor 410, bus 405, output device 435 (e.g., a display), and so forth, to carry out the function.

FIG. 4B illustrates a computer system 450 having a chipset architecture that can be used in executing the described method and generating and displaying a graphical user interface (GUI). Computer system 450 is an example of computer hardware, software, and firmware that can be used to implement the disclosed technology. System 450 can include a processor 455, representative of any number of physically and/or logically distinct resources capable of executing software, firmware, and hardware configured to perform identified computations. Processor 455 can communicate with a chipset 460 that can control input to and output from processor 455. In this example, chipset 460 outputs information to output 465, such as a display, and can read and write information to storage device 470, which can include magnetic media, and solid state media, for example. Chipset 460 can also read data from and write data to RAM 475. A bridge 480 for interfacing with a variety of user interface components 485 can be provided for interfacing with chipset 460. Such user interface components 485 can include a keyboard, a microphone, touch detection and processing circuitry, a pointing device, such as a mouse, and so on. In general, inputs to system 450 can come from any of a variety of sources, machine generated and/or human generated.

Chipset 460 can also interface with one or more communication interfaces 490 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 455 analyzing data stored in storage 470 or RAM 475. Further, the machine can receive inputs from a user via user interface components 485 and execute appropriate functions, such as browsing functions by interpreting these inputs using processor 455.

It can be appreciated that example systems 400 and 450 can have more than one processor 410 or be part of a group or cluster of computing devices networked together to provide greater processing capability.

For clarity of explanation, in some instances the present technology can be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Various aspects of the present technology provide systems and methods for managing a plurality of PSUs and a plurality of ATS modules in a server system. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present invention can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technology can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server farm can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the invention as set forth in the claims.

What is claimed is:

1. A rack system, comprising:
 a first AC input configured to receive a first AC power;
 a second AC input configured to receive a second AC power;
 a plurality of power supply units, each power supply unit of the plurality of power supply units being configured to supply power to at least one component of the rack system;
 a plurality of switch modules coupled to the first AC input and the second AC input, each of the plurality of switch modules having a port to receive at least one of an AC fail signal, an auxiliary power, and an AC initial signal from the plurality of power supply units or a component of a back plane of the rack system, wherein each of the plurality of power supply units is connected to a corresponding one switch module of the plurality of switch modules; and
 a controller, being connected to the plurality of power supply units and the plurality of switch modules, wherein the controller is configured to manage the plurality of power supply units and the plurality of switch modules and, in response to detecting that a first power supply unit fails, electronically isolate the first power supply unit from other power supply units of the rack system to allow the first power supply unit to be replaced without forcing a shutdown of the plurality of power supply units,
 wherein the controller is further configured to determine an optimized output power of the plurality of power supply units based at least upon a status of each power supply unit of the plurality of power supply units, and, in response to detecting that the first power supply unit or the first switch module fails, determine a new optimized output power of the plurality of power supply units based at least upon statuses of remaining power supply units of the plurality of power supply units.

2. The rack system of claim 1, wherein each switch module of the plurality of switch modules is configured to select either the first AC input or the second AC input to receive an AC power during an initialization based at least upon the AC initial signal.

3. The rack system of claim 1, wherein each switch module of the plurality of switch modules is configured to determine a status of a connected AC power based at least upon an AC OK signal received from a paired power supply unit.

4. The rack system of claim 1, wherein the auxiliary power to each switch module of the plurality of switch modules is an output signal of the plurality of power supply units, the auxiliary power being uninterruptible unless the plurality of power supply units, the first AC power and the second AC power have failed.

5. The rack system of claim 1, wherein each switch module of the plurality of switch modules comprises an over-current protection circuit, the over-current protection circuit being configured to cap an input current of a corresponding switch module or an input current of a paired power supply unit.

6. The rack system of claim 1, wherein each switch module of the plurality of switch modules is configured to select the second AC input to receive an AC power in response to determining that the first AC power has a quality below a threshold AC quality.

7. The rack system of claim 6, wherein the threshold AC quality includes within a range of AC voltage value, within a range of AC frequency, or above a threshold power factor value.

8. The rack system of claim 1, wherein the first AC power and the second AC power are supplied by different power vendors, the power vendors have different fee schedules, each switch module of the plurality of switch modules configured to select either the first AC input or the second AC input based upon the fee schedules to minimize an electricity cost of the rack system.

9. The rack system of claim 1, wherein the controller is connected to the plurality of switch modules and the plurality of switch power supply units via a data bus.

10. The rack system of claim 1, wherein at least one power supply unit of the plurality of switch modules comprises a light indicator, the light indicator being configured to show an operation status of the at least one power supply unit by emitting lights with different colors, wherein the controller is further configured to, in response to detecting that the at least one power supply unit fails, send a control signal to cause the light indicator to emit a light with a specific color.

11. The rack system of claim 1, further comprising a network switch, the network switch being configured to enable a remote controller or an administrator to remotely manage the plurality of power supply units and the plurality of switch modules.

12. The rack system of claim 1, wherein the controller is further configured to manage a loading of the rack system based at least upon the new optimized output power of the plurality of power supply units.

13. A computer-implemented method for managing a plurality of power supply units and a plurality of switch modules of a server system, comprising:
 monitoring statuses of the plurality of power supply units and the plurality of switch modules, each power supply unit of the plurality of power supply units being connected to a corresponding one switch module of the plurality of switch modules;

in response to determining that a first power supply unit of the plurality of power supply units or a first switch module of the plurality of switch modules fails, generating an alarm report; and electronically isolating the first power supply unit from other power supply units of the plurality of power supply units to allow the first power supply unit to be replaced without forcing a shutdown of the other power supply units;

determining an optimized output power of the plurality of power supply units based at least upon a status of each power supply unit of the plurality of power supply units; and managing a loading of the server system based at least upon the optimized output power of the plurality of power supply units.

14. The computer-implemented method of claim 13, further comprising: collecting historical data of the loading of the server system and an output power of the plurality of power supply units;

analyzing collected historical data; and determining a correlation between the loading of the server system and the output power of the output power of the plurality of power supply units.

15. The computer-implemented method of claim 14, further comprising:

based at least upon a projected loading of the server system, managing at least one power supply unit of the plurality of power supply units between operation states of hibernation, power on, and power off.

16. A non-transitory computer-readable storage medium storing instructions that, when executed by at least one processor of a server system, cause the server system to:

monitoring statuses of the plurality of power supply units and the plurality of switch modules, each power supply unit of the plurality of power supply units being connected to a corresponding one switch module of the plurality of switch modules;

in response to determining that a first power supply unit of the plurality of power supply units or a first switch module of the plurality of switch modules fails, generating an alarm report; and cause the first power supply unit to be electronically isolated from other power supply units of the plurality of power supply units to allow the first power supply unit to be replaced without forcing a shutdown of the other power supply units;

determining an optimized output power of the plurality of power supply units based at least upon a status of each power supply unit of the plurality of power supply units; and managing a loading of the server system based at least upon the optimized output power of the plurality of power supply units.

17. A rack system, comprising:

a first AC input configured to receive a first AC power;

a second AC input configured to receive a second AC power;

a plurality of power supply units, each power supply unit of the plurality of power supply units being configured to supply power to at least one component of the rack system;

a plurality of switch modules coupled to the first AC input and the second AC input, each of the plurality of switch modules having a port to receive at least one of an AC fail signal, an auxiliary power, and an AC initial signal from the plurality of power supply units or a component of a back plane of the rack system, wherein each of the plurality of power supply units is connected to a corresponding one switch module of the plurality of switch modules; and a controller, being connected to the plurality of power supply units and the plurality of switch modules, wherein the controller is configured to manage the plurality of power supply units and the plurality of switch modules and, in response to detecting that a first switch module fails, electronically isolate the first switch module from other switch modules of the rack system to allow the first switch module to be replaced without forcing a shutdown of the plurality of power supply units, wherein the controller is further configured to determine an optimized output power of the plurality of power supply units based at least upon a status of each power supply unit of the plurality of power supply units, and, in response to detecting that the first power supply unit or the first switch module fails, determine a new optimized output power of the plurality of power supply units based at least upon statuses of remaining power supply units of the plurality of power supply units.

* * * * *